United States Patent [19]
Takasu

[11] Patent Number: 5,296,086
[45] Date of Patent: Mar. 22, 1994

[54] METHOD FOR MANUFACTURING SEMICONDUCTOR DEVICE HAVING GROWN LAYER ON INSULATING LAYER

[75] Inventor: Hidemi Takasu, Kyoto, Japan

[73] Assignee: Rohm Co., Ltd., Kyoto, Japan

[21] Appl. No.: 788,397

[22] Filed: Nov. 6, 1991

[30] Foreign Application Priority Data

Jul. 25, 1991 [JP] Japan .................... 3-186280

[51] Int. Cl.$^5$ ............................. C30B 25/14
[52] U.S. Cl. ....................... 156/610; 156/612; 156/DIG. 64
[58] Field of Search ........... 156/610, 612, DIG. 64, 156/DIG. 68; 437/84, 100; 148/DIG. 148

[56] References Cited

U.S. PATENT DOCUMENTS

| | | | |
|---|---|---|---|
| 3,425,879 | 2/1969 | Shon et al. | 156/612 |
| 3,571,919 | 3/1971 | Gleim et al. | 437/100 |
| 4,560,642 | 12/1985 | Yonezawa et al. | 156/DIG. 64 |
| 4,670,086 | 6/1987 | Leamy | 156/DIG. 64 |
| 4,670,088 | 6/1987 | Tsaur | 156/DIG. 64 |
| 4,891,092 | 1/1990 | Jastrebski | 156/612 |

FOREIGN PATENT DOCUMENTS

| | | | |
|---|---|---|---|
| 399241 | 11/1990 | European Pat. Off. | 437/100 |
| 2-172894 | 7/1990 | Japan | 156/DIG. 68 |

OTHER PUBLICATIONS

"Lateral Epitaxial Overgrowth of Silicon on SiO$_2$" by D. D. Rathman et al, Journal of Electrochemical Society Solid-State Science and Technology, Oct., 1982, pp. 2303-2306.

"New SOI-Selective Nucleation Epitary" by Ryudai Yonehara et al, Preliminary Bulletin for the 48th Fall Academic Lecture 1987, by the Applied Physics Society, 19p-Q-15, p. 583.

*Primary Examiner*—Robert Kunemund
*Attorney, Agent, or Firm*—Lowe, Price, LeBlanc & Becker

[57] ABSTRACT

A semiconductor device is manufactured by forming an epitaxial layer (22) insulated from a silicon substrate (2), and forming a device in the epitaxial layer (22). On the semiconductor substrate (2), a silicon dioxide layer (4) is formed (FIG. 2A). Then the silicon dioxide layer (4) is provided with openings (14) (FIG. 2D). Silicon carbide is grown until it protrudes from the openings (14) to thereby form a silicon carbide seed crystal layer (16) (FIG. 2E). Next, oxidation is carried out, allowing a field oxide layer (20) to be bonded at the portion under the openings (14) and the silicon carbide seed crystal layer (16) to be insulated from the silicon substrate (2). Thereafter, epitaxial growth is effected from the silicon carbide seed crystal layer (16), thus obtaining an epitaxially grown layers (22). The device is formed in this epitaxially grown layer (22). The silicon carbide grown layer (22) is isolated from the silicon substrate (2) and has the uniform plane bearing, thus allowing no electrostatic capacitance to be caused due to pn junction with the silicon substrate (2) and high-speed operation to be realized. Moreover, the unique plane bearing facilitates control during the manufacturing process.

6 Claims, 5 Drawing Sheets

METHOD FOR MANUFACTURING SEMICONDUCTOR DEVICE HAVING GROWN LAYER ON INSULATING LAYER

BACKGROUND OF THE INVENTION

1. FIELD OF THE INVENTION

The present invention relates to methods for manufacturing semiconductor devices and, more particularly, to a method for manufacturing structures having a semiconductor layer on an insulating layer.

2. DESCRIPTION OF THE PRIOR ART

Semiconductor microchips or integrated circuits in general are provided in a structure in which an epitaxially grown layer is formed on a silicon substrate, and circuits are then formed in the epitaxially grown layer. The silicon substrate and the epitaxially grown layer are joined together to form a pn junction. The resulting capacitance of the pn junction, however, is such that it reduces the operating speed of the device. Accordingly, this structure was not suitable for forming devices requiring high-speed operation.

In the last few years, to solve this problem, a way of forming an additional silicon monocrystal layer to overlie the insulating layer on the silicon substrate (Semiconductor on Insulator, or SOI, technique) has been sought. This is to eliminate the pn junction between the semiconductor device formed on the silicon monocrystal layer and the silicon substrate, by insulating the silicon monocrystal layer from the silicon substrate.

FIGS. 1A-1B illustrates the conventional SOI technique using the ELO (Epitaxial Lateral Overgrowth) method ("Lateral Epitaxial Overgrowth of Silicon on SiO$_2$," by D. D. Rathman et. al., JOURNAL OF ELECTROCHEMICAL SOCIETY SOLID-STATE SCIENCE AND TECHNOLOGY, October, 1982, p. 2303). First, a silicon dioxide layer 4 is grown on top of a semiconductor substrate 2. Then, the silicon dioxide layer 4 is etched using photoresist to thereby open seed windows 6 (see FIG. 1A). This is followed by selective epitaxial growth of silicon in the longitudinal direction from the seed windows 6 and, subsequently, lateral epitaxial growth, to form an epitaxial layer 8 on the silicon dioxide layer 4 (see FIG. 1B). By these processes, the pn junction between the epitaxial layer 8 and the silicon substrate 2 can be reduced in area to the size of the seed window 6, thus allowing the pn junction capacitance to be reduced and high-speed operation of the device to be realized.

Another method available is the SENTAXY method ("New SOI-Selective Nucleation Epitaxy," by Ryudai Yonehara et. al., Preliminary Bulletin for the 48th Fall Academic Lecture 1987 by the Applied Physics Society, 19p-Q-15, p. 583). In this method, a plurality of crystal-grown silicon nuclei are formed on an insulating layer of silicon dioxide or the like, further effecting epitaxial growth from each of the nuclei. Methods of forming the nuclei which are under discussion include formation of a small-area silicon nitride layer composed of the nuclei, or employment of the FIB (Focused Ion Beam) method. Using this method allows the epitaxial layer and the silicon substrate to be isolated from one another by an oxide layer, which will solve the aforementioned problems.

However, the conventional SOI technique described above would involve the following problem.

In the ELO method shown in FIG. 1, the junction, although reduced indeed, is not wholly eliminated. This would arrest further increase of the operating speed of the device.

In the SENTAXY method, on the other hand, the epitaxial layer and the silicon substrate are isolated from one another, thus overcoming the above problem. However, the SENTAXY method involves differentiation in the plane bearing of the epitaxial layer that grows from each of the nuclei. This differentiation in the plane bearing of the epitaxial layer will cause variation in oxidation rate and other characteristics, with the result that a device having desired characteristics cannot be formed uniformly.

SUMMARY OF THE INVENTION

An object of the present invention, therefore, is to overcome the aforementioned problems and provide a semiconductor device having a silicon grown layer which is isolated from the substrate by an insulating layer and uniform in plane bearing.

A method for manufacturing a semiconductor device having a grown layer on an insulating layer in accordance with an embodiment of the invention, comprises:

an insulating layer formation step of forming an oxide insulating layer on a silicon substrate;

an opening formation step of providing the oxide insulating layer with an opening for seed crystal growth;

a seed crystal growth step of effecting crystal growth until the silicon carbide seed crystal layer protrudes slightly from the opening with the oxide insulating layer used as a mask;

a selective oxidation step of oxidizing the silicon substrate under the opening with the barrier layer used as a barrier, thereby cutting off the connection between the silicon carbide seed crystal layer and the silicon substrate;

a silicon carbide growth step of subjecting the silicon grown layer to crystal growth on the basis of the silicon carbide seed crystal layer; and a device formation step of forming a semiconductor device on the silicon carbide grown layer.

While the novel features of the invention are set forth in a general fashion, particularly in the appended claims, the invention, both as to organization and content, will be better understood and appreciated, along with other objects and features thereof, from the following detailed description taken in conjunction with the drawings.

DESCRIPTION OF THE PREFERRED EMBODIMENT

Figure 1:
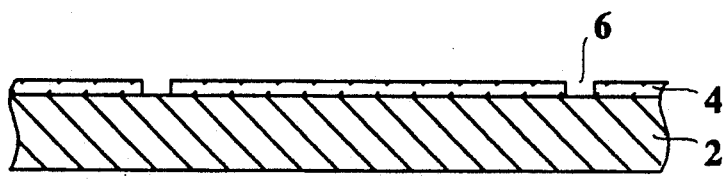
FIGS. 1A to 1B are views illustrating a conventional SOI (Semiconductor On Insulator) technique using a ELO (Epitaxial Lateral Overgrowth) method.
Figure 1:
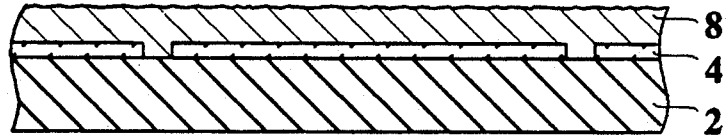
Figure 2A:
FIGS. 2A to 2E and 3A to 3C are views illustrating a method for manufacturing a semiconductor device according to one embodiment of the present invention.
Figure 2B:
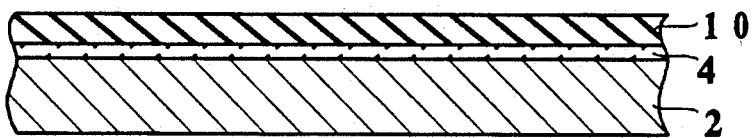
Figure 2C:
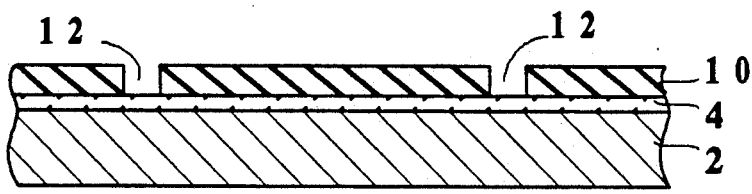
Figure 2D:

A method for manufacturing a semiconductor device according to an embodiment of the present invention is shown in FIGS. 2A-2B and 3A-3C. First, a silicon substrate 2 is placed in an oxygen atmosphere, with temperature increased to high, thereby thermally oxidizing the substrate surface. As a result, a silicon dioxide layer 4 ($SiO_2$), serving as an oxide insulating layer, is formed on the top of the silicon substrate 2, as shown in FIG. 2A. Preferably, the silicon dioxide layer 4 is formed thin, for example, approximately 30 to 300 nm thick. Next, as shown in FIG. 2B, photoresist 10 is applied onto the silicon dioxide layer 4. After a mask is placed on the photoresist 10 and exposed to ultraviolet rays, openings 12 are formed, as shown in FIG. 2C. In this state, with the photoresist 10 used as a mask, the silicon dioxide layer 4 is subjected to etching. Subsequently, the photoresist 10 is removed by use of a mixed liquid of sulfuric acid and hydrogen peroxide. Thus, openings 14 for seed crystal growth are formed, as shown in FIG. 2D. The width of the openings 14 is less than 2 $\mu$m.

In the step shown in FIG. 2D, the surface of the silicon substrate 2 exposed at the area of opening 14 is carbonized. Carbonization is intended to reduce the lattice inconsistency between the silicon substrate 2 and the seed crystal layer 16 (3C-SiC) at the next step of growing a silicon carbide layer, that is, to provide a buffer layer by carbonizing the surface of the silicon substrate 2.

Figure 2E:

The openings 14 are then selectively subjected to epitaxial growth of silicon carbide monocrystal, so that seed crystal layers 16 are formed as shown in FIG. 2E. The epitaxial growth at this step is controlled so as to suppress lateral growth. The longitudinal growth is allowed to range approximately 1 to 4 $\mu$m, while the lateral growth is suppressed to remain within 1 $\mu$m.

During growth of the seed crystal layer 16, there may arise stacking faults at the interface with the silicon dioxide layer 4. Due to this, the layer 4 of silicon dioxide is formed thin so as to reduce the interface area, as described above, to prevent stacking faults. Further, the epitaxial growth is preferably carried out at as low a temperature as possible, within the approximate range of 1100° C. to 1200° C.; epitaxial growth carried out at such a low temperature will enable stacking faults to be suppressed. Moreover, when the silicon dioxide layer 4 is formed to a silicon substrate (100) in a rectangular pattern in the direction of <100>, stacking faults can be further suppressed. And still further, when a thin polysilicon or nitride silicon layer is added to the sidewall of the silicon dioxide layer 4 prior to the growth in order to improve the lattice consistency, the crystal faults can also be suppressed. Each of the seed crystal layers 16 formed by the above steps has the same plane bearing.

Figure 3A:
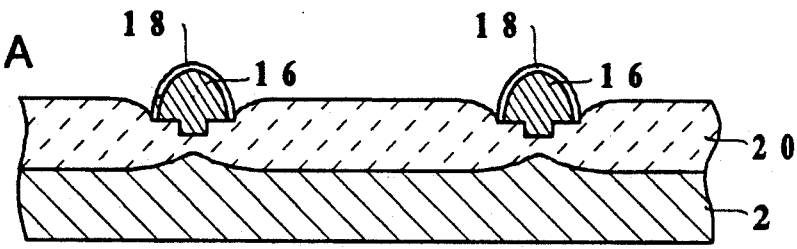

Oxidation-treatment follows this, oxidizing the silicon dioxide layer 4 and the silicon substrate 2, to form the field oxide layer 20. The field oxide layer 20 also grows laterally at its ends (Bird's Beak phenomenon). As a result, the silicon dioxide layer 4 connects to one another under the opening 14 by the oxidation-treatment as shown in FIG. 3A.

Further, the seed crystal layer 16 made up of silicon carbide has sufficiently low oxidation rate as compared with that of the silicon dioxide layer 4 and the silicon substrate 2, so that the oxide layer 18 is thinly formed only outside while most part remains in just the state of silicon carbide.

Incidentally, in the above oxidation treatment, the oxidation may be effected after the silicon dioxide layer 4 is removed.

Figure 3B:
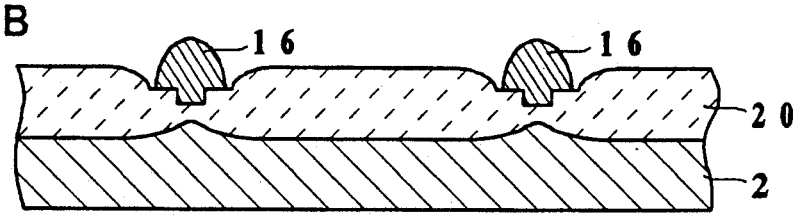

Subsequently, etching is performed using buffered hydrogen fluoride or the like to remove the silicon dioxide layer 18 outside the seed crystal layer 16 (see FIG. 3B). Thereafter, epitaxial growth is effected with the silicon carbide seed crystal layers 16 used as the seed crystal. The epitaxial growth at this step is controlled so as to increase lateral growth. As the growth continues, the layers grown out of each seed crystal layer 16 come to be connected to one another, resulting in the structure shown in FIG. 3C.

An epitaxially grown layer 22, which is a silicon carbide grown layer, is isolated from the silicon substrate 2 by the field oxide layer 20. Accordingly, it generates no electrostatic capacitance due to the pn junction with the silicon substrate 2. This means that forming devices (e.g. transistors, FETs) in each epitaxially grown layer 22 will not cause any reduction in operating speed due to electrostatic capacitance, allowing a high-speed device to be realized. Moreover, since no electrostatic capacitance is caused due to the pn junction, a good high-frequency characteristic and an enhanced latch-up characteristic can be obtained.

The plane bearing of each seed crystal layer 16 is uniform and, therefore, that of the epitaxially grown layer 22 is also uniform Accordingly, the oxidation rate is uniform, facilitating the control of device characteristics when forming devices in the epitaxially grown layer 22.

Figure 4:
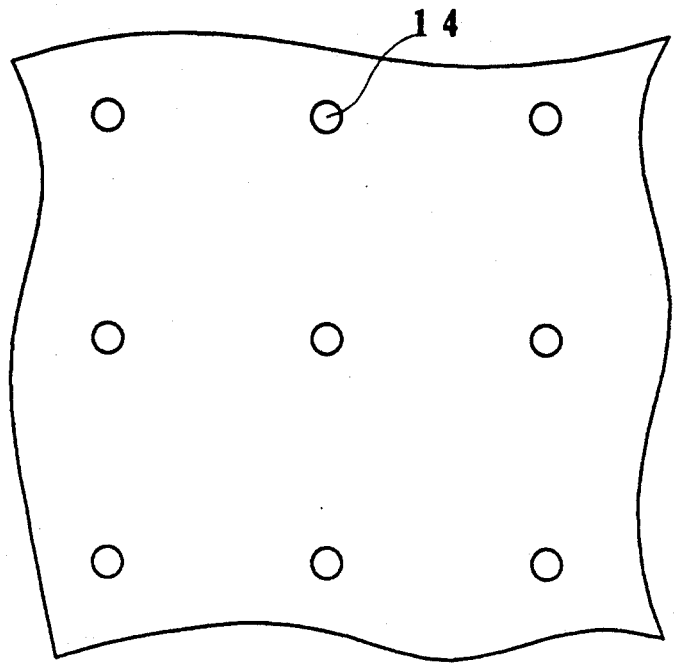
FIGS. 4 and 5 are plane views showing the opening 14 provided in the oxide insulating layer 4 of FIG. 2D.
Figure 5:
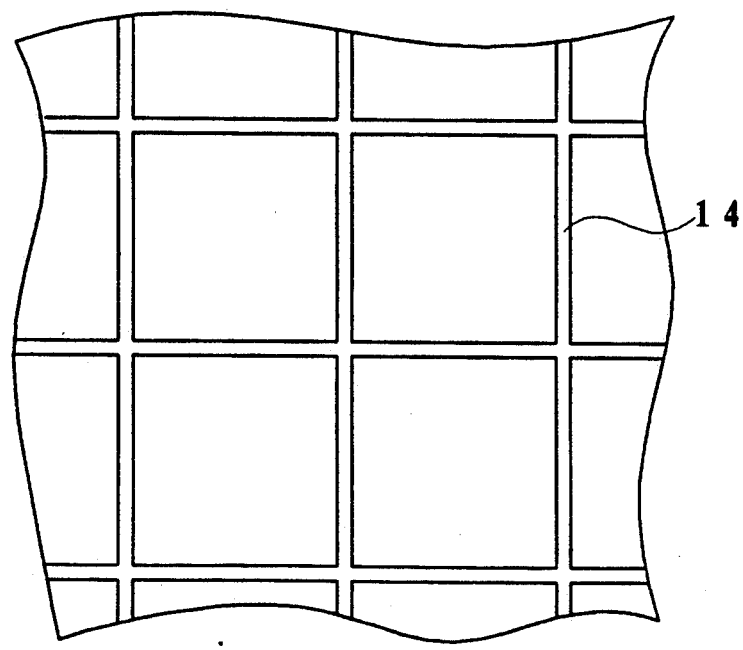

Further, the form of the openings 14 may be selected as appropriate to the required epitaxially grown layer 22. For example, they may be in the form of holes as shown in FIG. 4, or in lattice-like form as shown in FIG. 5. It may be further be preferable that the direction of patterning the silicon dioxide layer 4 be <100>, which can prevent the occurrence of all faults.

Figure 3C:
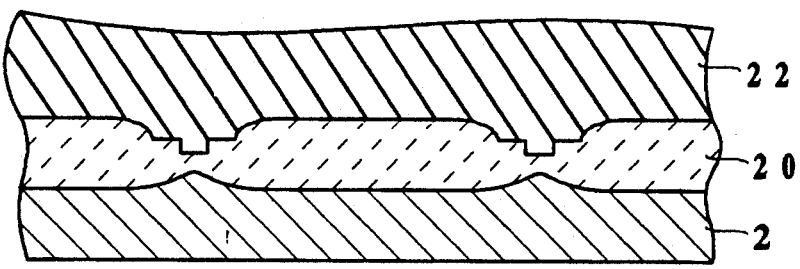

Moreover, when the steps shown in FIGS. 2A-2E and 3A-3C are added after the formation of devices in the epitaxially grown layer 22 in FIG. 3C, integrated circuits can be formed as a three-dimensional structure.

Figure 6:
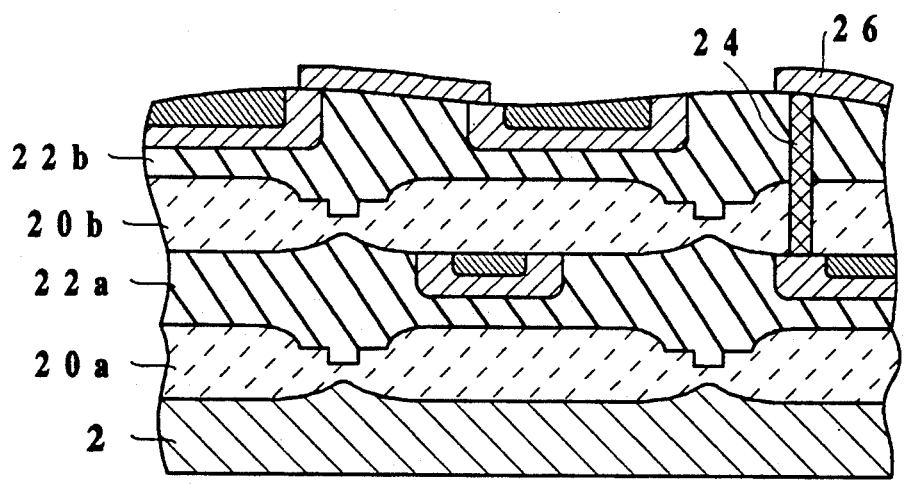
FIG. 6 is a view illustrating a semiconductor device formed as a three-dimensional structure by a manufacturing method according to the present invention.

FIG. 6 illustrates an example of the integrated circuit thus obtained. In this case, a field oxide layer 20b is provided on the epitaxially grown layer layer 22a and an additional epitaxially grown layer 22b is provided thereon. This allows the resulting integrated circuit to be high in degree of integration. In addition, to attach electrodes on devices formed on the epitaxially grown layer 22a, openings may be provided to connect a device to an electrode 26 with the aid of polysilicon 24 or the like.

Although only two epitaxial layers are provided in FIG. 6, there may be three or more layers formed in a similiar manner.

In the method for manufacturing a semiconductor device of the present invention, crystal growth is effected until the silicon carbide seed crystal layer protrudes from the opening of the oxide insulating layer, thus obtaining silicon carbide seed crystal layers having the same plane bearing. Moreover, oxidation of all the surface is carried out so that the silicon substrate under the opening is oxidized, in order to cut off the connection between the silicon carbide seed crystal layer and the silicon substrate. Subsequently, the silicon carbide grown layer is grown out of the silicon carbide seed crystal layer. As a result, a silicon carbide grown layer can be obtained which is isolated from the silicon substrate and has a uniform plane bearing. In other words, the silicon carbide grown layer can be formed without involving the pn junction with the silicon substrate, thus allowing the semiconductor device obtained to include a high-speed device. Also, the uniform plane bearing facilitates control during the formation of device components.

In the manufacturing methods of the present invention, after the opening formation step and before the seed crystal growth step, thin polysilicon layers or nitride silicon layers are formed on the oxide insulating layer of the opening sidewall. This arrangement serves to suppress any crystal faults to the opening sidewall from occurring during the crystal growth.

In the methods for manufacturing a semiconductor device of the present invention, the steps extending from insulating layer formation to device formation are repeated a specified number of times on the silicon carbide grown layer on which a semiconductor device is formed, to thereby obtain the silicon carbide grown layers insulated by a specified number of oxide insulating layers. As a result, a semiconductor device having a high degree of integration can be obtained as a three-dimensional structure.

Although the invention has been described in its preferred form with a certain degree of particularity, it is understood that the present disclosure of the preferred form has been changed in the details of its construction and any combination and arrangement of parts may be resorted to without departing from the spirit and the scope of the invention as hereinafter claimed.

What is claimed is:

1. A method for manufacturing semiconductor device having a grown layer on an insulating layer, comprises:
    an insulating layer formation step of forming an oxide insulating layer on a silicon substrate;
    an opening formation step of providing the oxide insulating layer with an opening for seed crystal growth;
    a silicon carbide seed crystal growth step of effecting crystal growth until the silicon carbide seed crystal layer protrudes slightly from said opening with the oxide insulating layer used as a mask;
    a selective oxidation step of oxidizing the silicon substrate under said opening thereby forming an oxide barrier layer cutting off the connection between the silicon carbide seed crystal layer and the silicon substrate;
    a silicon carbide growth step of subjecting the silicon grown layer to crystal growth on the basis of the silicon carbide seed crystal layer; and
    a device formation step of forming a semiconductor device on the silicon carbide grown layer.

2. A method as claimed in claim 1, further comprising:
    an oxide layer removal step of removing the oxide layer outside the silicon carbide seed crystal layer after the selective oxidation step and before the silicon carbide growth step.

3. A method as claimed in claim 1, further comprising:
    a step of forming a thin polysilicon layer or nitride silicon layer in the oxide insulating layer of an opening sidewall after the opening formation step and before the seed crystal growth step.

4. A method as claimed in claim 1, wherein said oxide insulating layer at the insulating layer formation step is a silicon dioxide layer.

5. A method as claimed in claim 4, wherein said silicon substrate has a plane bearing of 100, so that the silicon dioxide layer is also grown with a plane bearing of 100.

6. A method as claimed in claim 1, wherein the steps from said insulating layer formation step to said device formation step are repeated a specified number of times on the silicon carbide grown layer in which a semiconductor device is formed thereby to obtain a specified number of silicon carbide grown layers insulated by said oxidized insulator.

* * * * *